(12) United States Patent
Vinayak et al.

(10) Patent No.: US 7,783,269 B2
(45) Date of Patent: Aug. 24, 2010

(54) POWER AMPLIFIER CONTROLLER WITH POLAR TRANSMITTER

(75) Inventors: Vikas Vinayak, Menlo Park, CA (US); Serge Francois Drogi, Flagstaff, AZ (US); Martin Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 518 days.

(21) Appl. No.: 11/858,705

(22) Filed: Sep. 20, 2007

(65) Prior Publication Data
US 2009/0081968 A1 Mar. 26, 2009

(51) Int. Cl.
*H04B 1/04* (2006.01)
(52) U.S. Cl. ............... 455/126; 455/127.2; 455/240; 375/297; 330/136
(58) Field of Classification Search .......... 455/108, 455/110, 126, 127.1, 127.2, 232.1, 234.1, 455/240, 341; 375/297, 300, 302; 330/131, 330/136
See application file for complete search history.

(56) References Cited

U.S. PATENT DOCUMENTS

| | | | |
|---|---|---|---|
| 3,900,823 A | 8/1975 | Sokal et al. | |
| 4,420,723 A | 12/1983 | de Jager | |
| 5,128,629 A | 7/1992 | Trinh | |
| 5,142,240 A | 8/1992 | Isota et al. | |
| 5,675,288 A | 10/1997 | Peyrotte et al. | |
| 5,822,442 A | 10/1998 | Agnew et al. | |
| 5,880,633 A | 3/1999 | Leizerovich et al. | |
| 6,043,707 A | 3/2000 | Budnik | |
| 6,133,792 A | 10/2000 | Hansson | |
| 6,141,541 A | 10/2000 | Midya et al. | |
| 6,166,596 A | 12/2000 | Higashiyama et al. | |
| 6,175,273 B1 | 1/2001 | Sigmon et al. | |
| 6,300,826 B1 | 10/2001 | Mathe et al. | |
| 6,353,359 B1 | 3/2002 | Leizerovich | |
| 6,377,784 B2 | 4/2002 | McCune | |

(Continued)

FOREIGN PATENT DOCUMENTS

EP 0812064 B1 12/1997

(Continued)

OTHER PUBLICATIONS

"The Changing Face of Amplifier Design," Nujira, [online] [Retrieved on Apr. 5, 2006] Retrieved from the Internet<URL:http://www.nujira.com/technology/>.

(Continued)

*Primary Examiner*—Nhan Le
(74) *Attorney, Agent, or Firm*—Fenwick & West LLP

(57) ABSTRACT

A power amplifier controller controls a power amplifier and is coupled to a polar modulator. The polar modulator generates an amplitude component and a phase-modulated component of the desired RF modulated signal, and outputs to the power amplifier controller. The power amplifier controller regenerates a combined phase and amplitude modulated RF signal to generate an input signal to a power amplifier by adjusting the gain of a VGA based on the amplitude component of the desired RF modulated signal. Concurrently, the power amplifier controller both controls an adjusted supply voltage to the PA and adjusts the gain of the VGA based upon an amplitude correction signal or amplitude error signal.

24 Claims, 7 Drawing Sheets

U.S. PATENT DOCUMENTS

| | | | |
|---|---|---|---|
| 6,404,823 | B1 | 6/2002 | Grange et al. |
| 6,437,641 | B1 | 8/2002 | Bar-David |
| 6,445,249 | B1 | 9/2002 | Khan et al. |
| 6,472,934 | B1 | 10/2002 | Pehlke |
| 6,528,975 | B2 | 3/2003 | Sander |
| 6,531,917 | B2* | 3/2003 | Yamamoto et al. .......... 330/149 |
| 6,583,664 | B2 | 6/2003 | Mathe et al. |
| 6,661,210 | B2 | 12/2003 | Kimball et al. |
| 6,781,452 | B2 | 8/2004 | Cioffi et al. |
| 6,917,244 | B2 | 7/2005 | Rosnell et al. |
| 6,924,695 | B2 | 8/2005 | Cioffi et al. |
| 6,924,700 | B2 | 8/2005 | Taura et al. |
| 6,924,711 | B2 | 8/2005 | Liu |
| 6,928,272 | B2 | 8/2005 | Doi |
| 7,058,373 | B2 | 6/2006 | Grigore |
| 7,058,425 | B1* | 6/2006 | Takakusaki ................. 455/561 |
| 7,071,774 | B2* | 7/2006 | Hellberg ................. 330/124 R |
| 7,082,290 | B2* | 7/2006 | Takano et al. ............... 455/102 |
| 7,109,897 | B1 | 9/2006 | Levesque |
| 7,197,286 | B2 | 3/2007 | Ode et al. |
| 7,570,928 | B2* | 8/2009 | Magoon et al. ............. 455/102 |
| 2002/0053897 | A1 | 5/2002 | Kajiwara et al. |
| 2002/0168949 | A1 | 11/2002 | Johannisson et al. |
| 2003/0017840 | A1 | 1/2003 | Katagishi et al. |
| 2003/0155978 | A1 | 8/2003 | Pehlke |
| 2004/0071225 | A1 | 4/2004 | Suzuki et al. |
| 2004/0162039 | A1 | 8/2004 | Marque-Pucheu |
| 2004/0189378 | A1 | 9/2004 | Suzuki et al. |
| 2004/0263254 | A1 | 12/2004 | Tahara et al. |
| 2005/0064830 | A1 | 3/2005 | Grigore |
| 2005/0122163 | A1 | 6/2005 | Chu |
| 2005/0156662 | A1 | 7/2005 | Raghupathy et al. |
| 2005/0242880 | A1 | 11/2005 | Domokos et al. |
| 2006/0001483 | A1 | 1/2006 | Cioffi et al. |
| 2007/0096806 | A1 | 5/2007 | Sorrells et al. |
| 2007/0184796 | A1 | 8/2007 | Drogi et al. |
| 2008/0075194 | A1* | 3/2008 | Ravi et al. .................. 375/297 |

FOREIGN PATENT DOCUMENTS

WO          WO 9534128 A1    12/1995

OTHER PUBLICATIONS

Fergus, T.J., "EDGE Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD83 02'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

PCT International Search Report and Written Opinion, PCT/US07/61578, Oct. 11, 2007, 7 pages.

PCT International Search Report and Written Opinion, PCT/US07/02389, Oct. 19, 2007, 10 pages.

PCT International Search Report and Written Opinion, PCT/US07/02676, Nov. 6, 2007, 9 pages.

PCT International Search Report and Written Opinion, PCT/US07/61499, Nov. 6, 2007, 11 pages.

Raab, F. et al., "RF and Microwave Power Amplifier and Transmitter Technologies—Part 3," High Frequency Electronics, Sep. 2003, pp. 34-48.

Raab, F. et al., "RF and Microware Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

PCT International Search Report and Written Opinion, PCT/US2008/075153, Nov. 14, 2008, 11 pages.

\* cited by examiner

POWER AMPLIFIER CONTROLLER WITH POLAR TRANSMITTER

CROSS-REFERENCE TO RELATED APPLICATIONS

This application is related to U.S. patent application Ser. No. 11/670,931 entitled "Amplifier Compression Control Circuit" filed on Feb. 2, 2007 and U.S. patent application Ser. No. 11/429,119 entitled "Power Amplifier Controller Circuit" filed on May 4, 2006, the entire contents of which are both incorporated by reference herein in their entirety.

BACKGROUND OF THE INVENTION

1. Field of the Invention

The present invention relates to a circuit for controlling RF PAs (Radio Frequency Power Amplifiers), and more specifically, to an RF PA controller circuit that operates with a polar transmitter.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life on these portable electronic devices. For example, cellular telephone makers make great efforts to increase the efficiency of the RF PA circuits, because the efficiency of the RF PAs is one of the most critical factors determining the battery life of the cellular telephone and its talk time.

FIG. 1 illustrates an example of a conventional RF transmitter circuit, including a polar modulator 102 (sometimes referred to as a polar transmitter) and an external power amplifier (PA) 104. For example, the RF transmitter circuit may be included in a cellular telephone device using one or more cellular telephone standards (modulation techniques) such as EDGE, UMTS (Universal Mobile Telephony System) or CDMA (Code Division Multiple Access), although the RF transmitter circuit may be included in any other type of RF electronic device. For purposes of illustration only, the RF transmitter circuit will be described herein as a part of a cellular telephone device. The polar modulator 102 includes an envelope generator 304 for generating an amplitude component 105 of the desired RF modulated signal and a phase generator 305 for generating the phase component 307 of the desired RF modulated signal. A phase modulator 306 receives the phase component 307 and modulates the signal onto an RF carrier for output to a variable gain amplifier (VGA) 107 as the phase modulated signal 108. The amplitude component 105 modulates the gain of the VGA 107, thus combining the amplitude component 105 and phase-modulated component 108 to generate the RF signal 106 to be amplified by the PA 104 and transmitted 110 remotely by an antenna (not shown). For example, the RF signal 106 may be an RF signal modulated by the polar modulator 102 according to the EDGE, UMTS or CDMA standard.

The RF power amplifier 104 in general includes an output transistor (not shown) for its last amplification stage. When an RF modulated signal 106 is amplified by the RF PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the RF PA 104 to sacrifice more efficiency. For instance, while the efficiency at peak power of an output transistor of the PA 104 can be above 60%, when a modulation format such as WCDMA is used, with certain types of coding, the efficiency of the RF PA 104 falls to below 30%. This change in performance is due to the fact that the RF transistor(s) in the RF PA 104 is maintained at an almost fixed bias during the off-peak of the amplitude of the RF input signal 106.

Certain conventional techniques exist to provide efficiency gains in the RF PA 104. One conventional technique is Large Signal Polar, shown in FIG. 2. The Large Signal Polar technique is a variation of the polar modulator described in FIG. 1. Here the amplitude component 105 and the phase modulated signal 108 of the desired RF modulated signal are applied separately to 2 ports of the power amplifier 104, i.e., its supply voltage port (Vcc) 109 and its RF input port 107, respectively. Modulating the supply voltage of the PA 104 dynamically adjusts the bias during the amplitude variations of the RF input signal 106 and therefore, in theory, improves the efficiency of PA 104. However, the Large Signal Polar technique often fails to provide significant net efficiency gains, because the supply voltage 109 to the PA 104 cannot be varied in an energy-efficient way to accommodate the large variations in the amplitude signal of the desired RF modulated signal and thus it fails to provide a substantial energy efficiency gain while maintaining the required linear amplification of the RF signal in the RF PA 104. This is mainly due to the difficulty in realizing a fast, accurate, wide range, and energy efficient voltage converter to drive the supply voltage of the RF PA 104.

The conventional Large Signal Polar technique can function better only if a variable power supply with a very large variation range is used to adjust the supply voltage based on the amplitude component 105 of the desired RF modulated signal, while not reducing the efficiency of the RF transmitter by power consumed by the power supply itself. However, the variable power supply, which is typically comprised of a linear regulator 111 that varies its output voltage on a fixed current load such as the PA 104 in linear mode, by principle reduces the supply voltage 109 at constant current and by itself consumes the power resulting from its current multiplied by the voltage drop across the linear regulator 111 when there is a large drop in the amplitude signal 105 of the desired RF modulated signal. This results in little change in the overall battery power being consumed by the RF transmitter, because any efficiency gained in the RF PA 104 is mostly lost in the linear regulator 111 itself.

Quite often, the conventional methods of controlling a PA fail to address the amplitude-to-phase re-modulation (AM-to-PM) which occurs in a non-frequency linear device such as a PA. Thus, the conventional methods are not suitable for the common types of PAs for use in common mobile telephony or mobile data systems because the required spectral occupancy performance is compromised by the AM to PM distortion.

Thus, there is a need for an RF PA system that is efficient over a wide variety of modulation techniques and results in a significant net decrease in power consumption by the RF PA circuit. There is also a need for a PA controller that can correct the AM to PM effects.

SUMMARY OF THE INVENTION

A power amplifier controller system controls a power amplifier (PA) and is coupled to a polar modulator. The polar modulator generates an amplitude component and phase-modulated component of the desired RF modulated signal, and outputs these to the power amplifier controller system. The power amplifier controller system regenerates a combined phase and amplitude modulated RF signal to generate an input signal to a power amplifier, by adjusting the gain of a variable gain amplifier (VGA) based on the amplitude component of the desired RF modulated signal. The power amplifier receives and amplifies this input signal and generates an output signal.

Concurrently, the power amplifier controller system both controls an adjustable supply voltage to the PA in an efficient manner, and adjusts the gain of the VGA, based upon an amplitude correction signal generated in an amplitude correction loop. The amplitude correction loop strives to minimize the difference between the amplitude of the output signal and the desired amplitude component generated by the polar modulator, to reduce amplitude distortion. Additionally, the power amplifier controller system may include a phase shifter to adjust the phase of the PA input signal. The phase shifter shifts the phase responsive to a phase correction signal generated in a phase correction loop. The phase correction loop strives to hold constant the phase difference between the phase of the output signal and the phase of the desired phase-modulated component generated by the polar modulator. The phase correction loop corrects for unwanted phase modulation introduced by the AM to PM non-ideality of the power amplifier and thus reduces phase distortion generated by the power amplifier. Advantageously, the power amplifier controller circuit controls the power amplifier so that it operates in an efficient manner while reducing distortion.

In a first embodiment, the amplitude correction signal is indicative of the difference between the amplitude component of the desired RF modulated signal and the amplitude of the output signal. The phase correction signal is indicative of the difference between the phase of desired RF signal and the phase of the output signal. The power supply of the PA can include a switching regulator for high efficiency. In this embodiment, the gain of the VGA is directly controlled by the amplitude component of the desired RF modulated signal and is further adjusted by the amplitude correction signal.

In a second embodiment, a delayed version of the amplitude component and phase modulated signals are compared to the output signal to generate the amplitude correction signal and phase correction signal respectively. The delay compensates for delay through the RF path to reduce glitches caused by misalignment of the signals. Furthermore, a split power supply is used to increase power efficiency. The split power supply comprises a linear regulator and a switched mode power supply to each supply a portion of the PA supply power responsive to different frequency ranges of the amplitude correction signal.

In a third embodiment, the second embodiment is combined with an alternative phase correction loop that provides the phase correction signal to the polar modulator. The polar modulator shifts the phase of the desired RF signal prior to phase modulation according to the phase correction signal.

Thus, the embodiment advantageously eliminates the phase shifter from the RF path and reduces the overall design complexity associated with this phase shifter.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
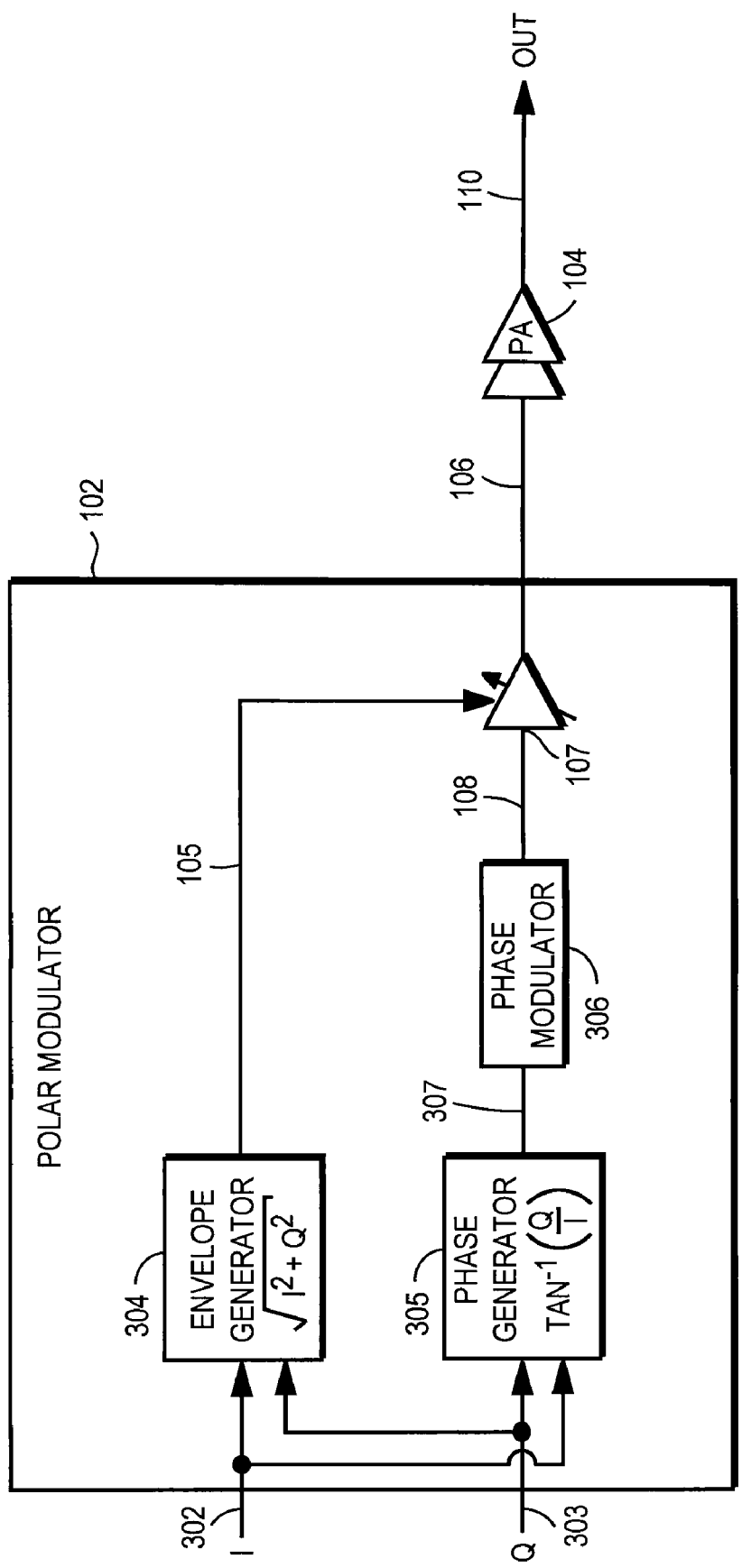
FIG. 1 illustrates a conventional RF transmitter circuit.
Figure 2:
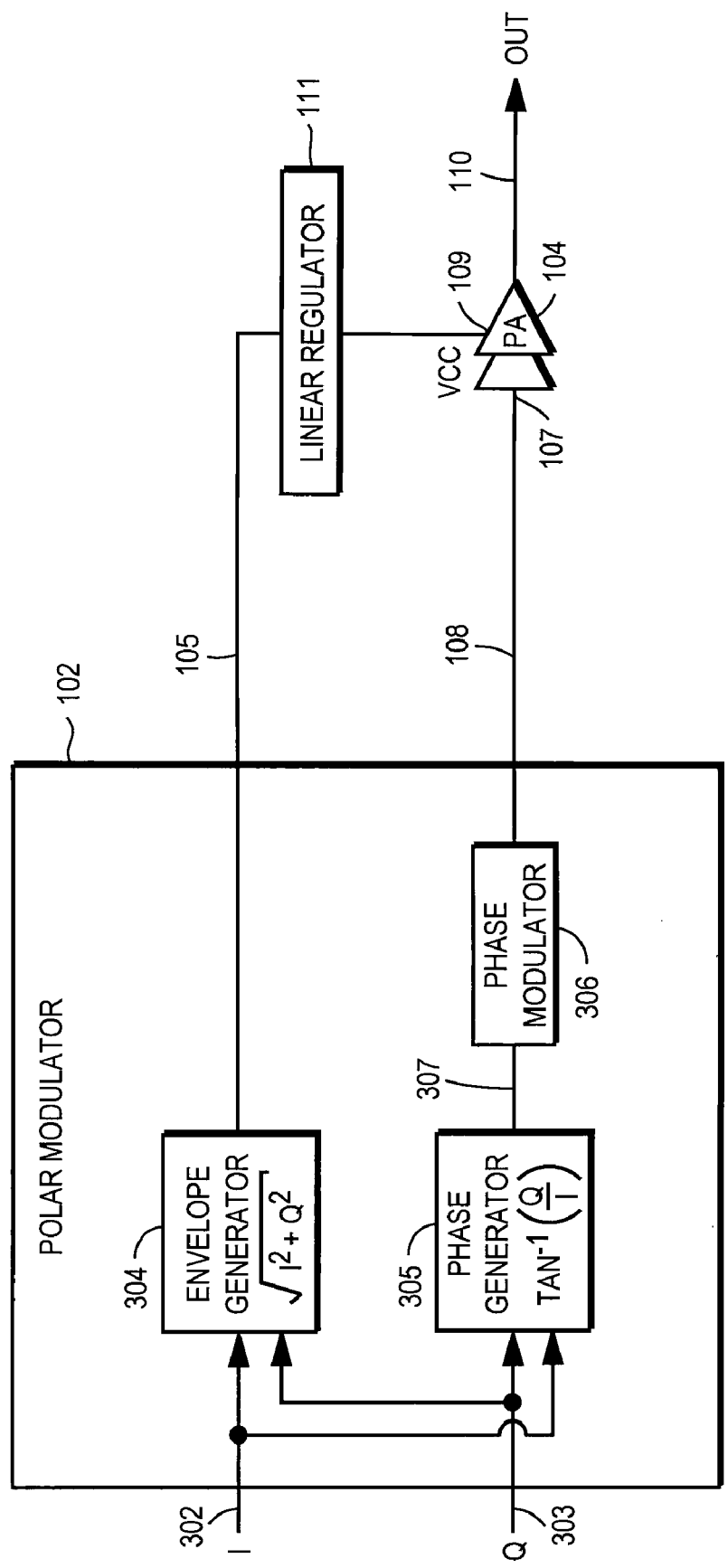
FIG. 2 illustrates a second embodiment of a conventional RF transmitter circuit in Large Signal Polar configuration.
Figure 3A:
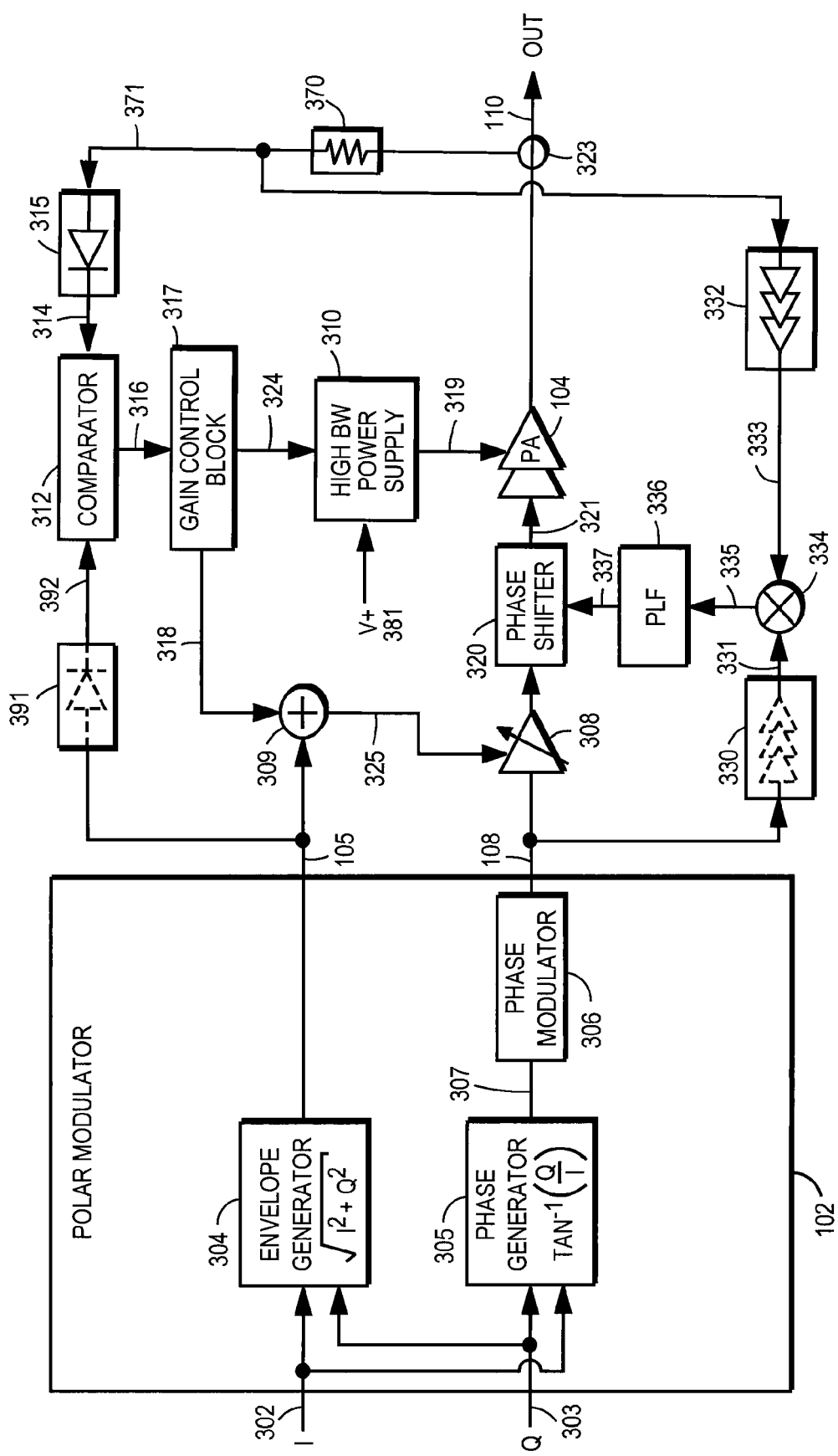
FIG. 3A illustrates an RF transmitter circuit including a PA controller in accordance with a first embodiment of the present invention.

FIG. 3A illustrates an RF transmitter circuit including a PA controller for operating with a polar modulator 102 according to a first embodiment of the present invention. The polar modulator 102 receives I,Q baseband signals 302, 303 and generates an amplitude component 105 of a desired RF signal and a phase modulated signal 108. A variable gain amplifier (VGA) 308 reconstructs the desired RF signal by recombining the phase modulated signal 108 and the amplitude component 105. A power amplifier 104 generates an amplified RF output signal 110 from the reconstructed RF signal 321. Additional circuitry of the PA controller provides feedback control signals that reduce distortion of the RF output signal 110 and increase power efficiency of the PA 104. Operation of the control circuit will be described in further detail below.

In one embodiment, the polar modulator 102 comprises an envelope generator 304, a phase generator 305, and a phase modulator 306. The envelope generator 304 receives the I,Q baseband signals 302, 303 and generates the amplitude component 105. In one embodiment, the amplitude component, r, 105 is generated according to $r=\sqrt{I^2+Q^2}$. The phase generator 305 receives the I,Q baseband signals 302, 303 and generates a phase component 307. In one embodiment, the phase component, θ, 307 is calculated according to $$\theta = \tan^{-1}\left(\frac{Q}{I}\right).$$

The envelope generator 304 and phase generator 305 can be implemented digitally or by using analog components.

The phase modulator 306 receives the phase component 307 and modulates it onto an RF carrier to generate the phase modulated signal 108. In this example, the phase modulator 306 may be comprised of a voltage controlled oscillator (VCO) controlled by a sigma-delta modulated fractional-N synthesizer (not shown), programmed to modulate the VCO according to the phase component 307 of the baseband signal 302, 303.

It is noted that in one embodiment, the polar modulator 102 receives the amplitude component 105 and phase component 307 directly from the baseband processor instead of receiving the I,Q 302, 303 baseband signals. Thus, in this embodiment, the I,Q conversion is not required.

The variable gain amplifier (VGA) 308 receives the phase modulated signal 108 from the polar modulator 102. The VGA 308 amplifies the phase modulated signal 108 according to a gain control signal 325. The gain control signal 325 is based in part on the amplitude component 105 and in part on a VGA correction signal 318. Thus, the gain control signal 325 controls the VGA 308 to reconstruct the desired RF signal by varying the gain of the VGA 308 based on the amplitude component 105, while the VGA correction signal 318 modifies the gain control signal 325 of the VGA 308 to correct for amplitude distortion as will be described below. The gain control signal 325 is generated by an adder 309 that adds the amplitude component 105 and the VGA correction signal 318. It is noted that the adder 309 is shown for simplicity herein, and may be replaced with a different function according to various embodiments. Thus, advantageously, a single VGA 308 may serve the dual function of reconstructing the desired RF signal in a polar transmitter (forward path), and correcting for amplitude distortions in an amplitude correction loop (feedback path).

Note that the VGA 308 may operate with a linear-to-logarithmic control (i.e. a linear change in control voltage 325 effects a logarithmic change in the gain). Thus, in one embodiment, an amplitude converter (not shown) ensures that a change in the amplitude component 105 of the desired RF signal causes a linear change in gain at the VGA 308. Adjustments in amplitude and offset may also be required depending on the design characteristics of the VGA 308. Furthermore, the design of the VGA 308 may result in a limited gain control range and therefore may not respond with its gain exactly following the amplitude component 105 of the desired RF signal. Thus, in reality, the VGA 308 responds to "at least a portion of" the amplitude component 105 of the desired RF signal.

The VGA 308 outputs to a phase shifter 320. The phase shifter 320 corrects for phase distortion in the RF signal in response to a phase correction signal 337. The phase correction signal 337 is generated according to a phase correction loop as will be described in further detail below. The phase-shifted signal is passed to the input 321 of PA 104 and amplified by the PA 104 to generate the amplified RF output signal 110.

A high bandwidth, high efficiency power supply (e.g., one which includes a switch mode power supply) 310 powered from a voltage, V+ 381, provides PA supply voltage 319 to the PA 104 according to the power supply control signal 324. V+ 381 may be supplied from a battery. Optionally, the amplitude component 105 also contributes to the power supply control signal 324 (not shown). The high BW power supply 310 may be limited in bandwidth, and, as with the VGA 308, limited in its output voltage range. Therefore, the high BW power supply 310 may not respond with its gain exactly following the amplitude component 105 of the desired RF signal. Thus, in reality, in this case the high BW power supply 310 responds to "at least a portion of" the amplitude component 105 of the desired RF signal.

As described above, it is noted that the amplitude component 105 of the desired RF signal is applied to control the gain of VGA 308 or both the gain of VGA 308 and the output voltage 319 of the high BW power supply 310 to yield an approximation of the desired RF signal at the output 110 that includes both amplitude and phase modulation.

An amplitude correction loop adjusts the gain of the VGA 308 and PA supply voltage 319 to the PA 104 based on the difference between the amplitude component 105 of the desired RF signal and the amplitude of the output signal 110. The output signal 110 is sampled by a sampling module 323 that may be, for example, a directional coupler with a coupling factor of −20 dB. The sampled output signal may be further attenuated by an attenuator 370. A detector 315 detects the sampled, attenuated output signal 371 and outputs the amplitude 314 to a comparator 312. The detector 315 may be, for example, a logarithmic-based RF detector. An amplitude scaling block 391 scales the amplitude of the amplitude component 105 of the desired RF signal to match the amplitude detection characteristics of the detector 315, and outputs an amplitude 392 to a second input of the comparator 312. The comparator 312 compares the amplitudes 314 and 392, and outputs the amplitude correction signal 316 to a gain control block 317. The gain control block 317 apportions the amplitude correction signal 316 to control the high BW power supply 310 and VGA 308. Typically, the amplitude correction signal 316 indicates that the PA supply voltage 319 and the gain of VGA 308 should each be raised if the output amplitude is lower than the amplitude component 105 of the desired RF signal, and indicates that the PA supply voltage 319 and the gain of VGA 308 should each be lowered if the output amplitude is greater than the amplitude component 105 of the desired RF signal.

The gain control block 317 apportions the amplitude correction signal 316 and generates the VGA correction signal 318 to control the gain of VGA 308 and the power supply control signal 324 to control the output voltage 319 of the high BW power supply 310. In one embodiment, two different frequency ranges of the amplitude correction signal 316 are assigned to control the VGA 308 and the high BW power supply 310 such that the VGA correction signal 318 contains higher frequency components than the power supply correction signal 324. This eases the bandwidth requirements of the high BW power supply 310. Additionally, different gain, scaling and offsets may be applied to optimize the drive level at the input to the PA 104 and may allow efficient operation at or beyond the compression point of the PA 104. Finally, basic lowpass filtering may be applied in the gain control block 317 to ensure overall stability of the amplitude correction loop.

Figure 3B:
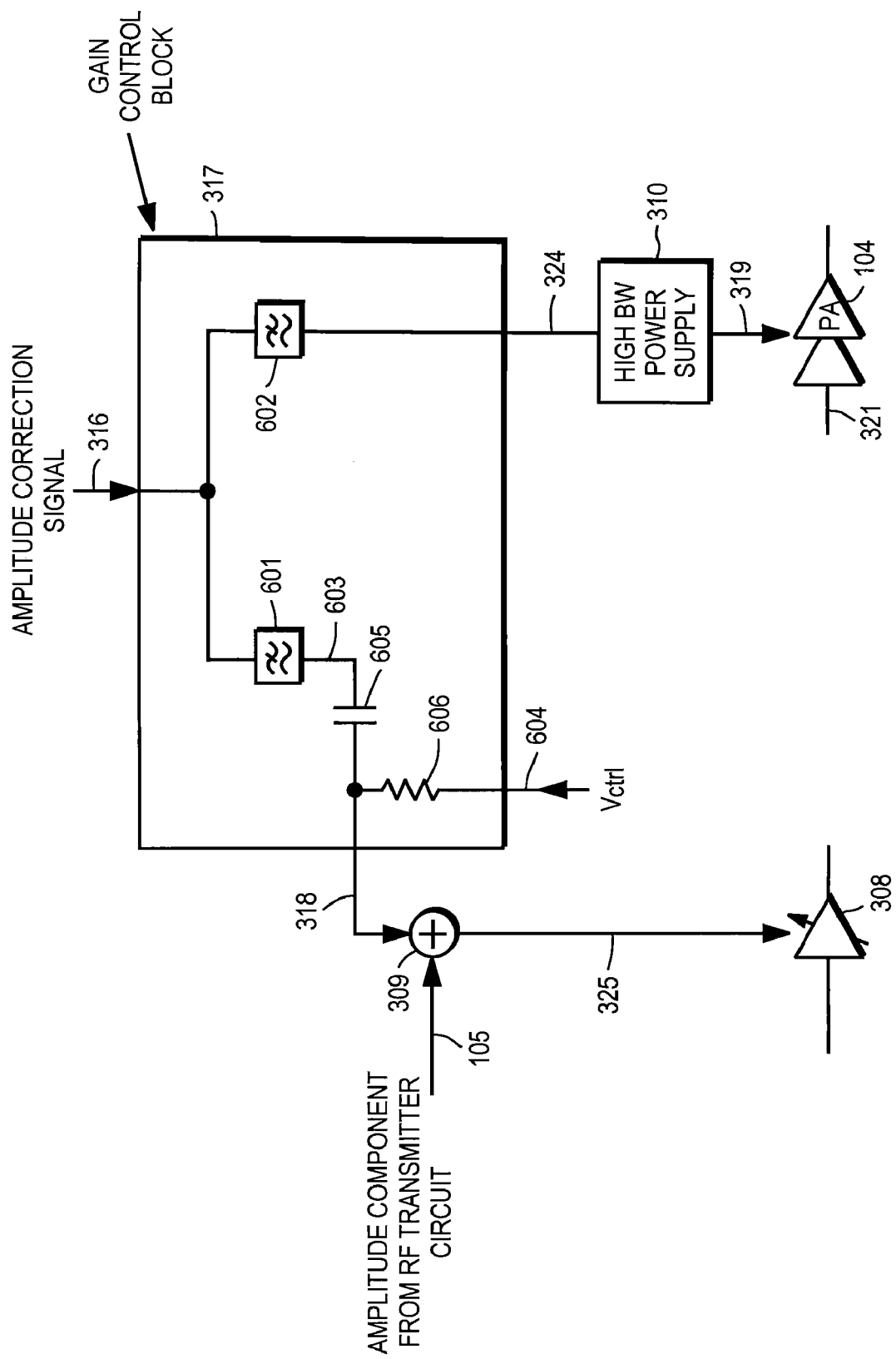
FIG. 3B illustrates a detail of the Gain Control Block and surrounding circuitry in accordance with the present invention.

FIG. 3B shows an example configuration of the gain control block 317. In the illustrated embodiment, filters 601 and 602 pass two different frequency ranges of amplitude correction signal 316 to control the VGA 308 and the high BW power supply 310, respectively, for reasons described previously. Different gain, scaling and offsets may be included in filters 601 and 602. Additionally, a capacitor 605 inserted between the filter 601 and the adder 309 serves as a DC block, effectively preventing the amplitude correction signal 316 from passing DC to the VGA correction signal 318 and ultimately to the VGA gain control signal 325, and consequently preventing the amplitude correction signal 316 from affecting the average gain of VGA 308. Instead, Vctrl 604, connected to a resistor 606, couples a DC level into the VGA correction signal 318. Vctrl 604 thus affects the average gain of VGA 308, providing a gain offset relative to the gain control supplied by the amplitude component 105 of the desired RF signal at the adder 309, and may be controlled by a DC feedback system. By setting Vctrl higher or lower, the output of VGA 308 can be made to drive the input 321 of PA 104 at a higher or lower average amplitude, thus controlling the level of compression of the PA 104. At a higher level of compression, the action of the amplitude correction loop forces the high BW power supply 310 into higher level of activity, since in compression the PA supply voltage 319 largely modulates the amplitude at the PA 104. While this mode of operation results in high efficiency, distortion may be increased due to bandwidth and voltage swing range limitations of the high BW power supply 310. At a lower level of compression, the PA 104 operates less efficiently, but reduces the burden on the high BW power supply 310. Thus adjusting the level of compression allows a tradeoff between efficiency of the PA 104 and spectral occupancy performance, as well as a tradeoff between efficiency of the PA 104 and the voltage swings and bandwidth required from the high BW power supply 310.

While the capacitor 605 and the resistor 606 are used to illustrate DC blocking from the amplitude correction signal 316 and DC coupling from the Vctrl signal 604, respectively, use of these components are exemplary. According to other embodiments, any circuit to block DC from the amplitude correction signal 316 and couple DC from Vctrl 604 can be used.

Figure 3C:
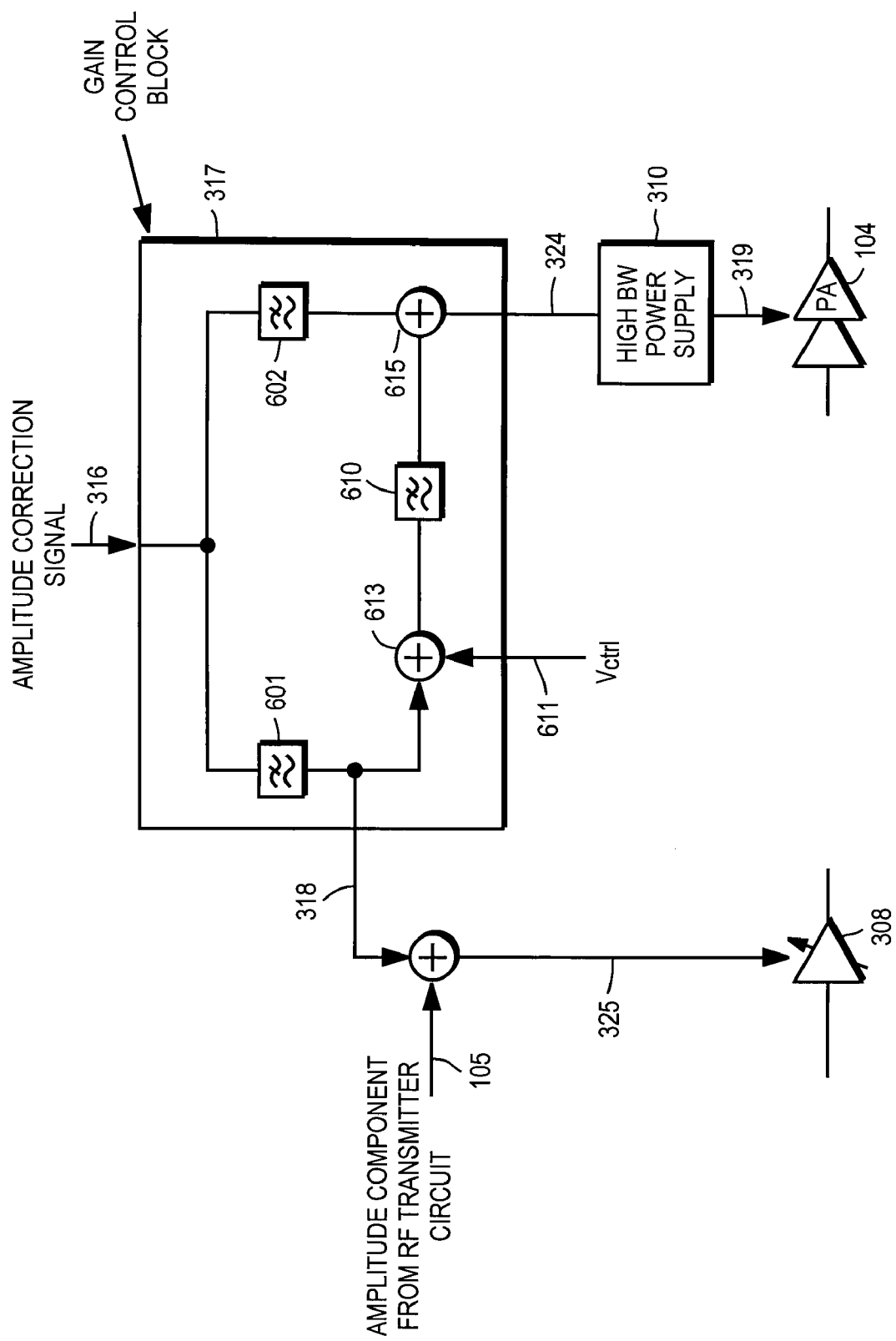
FIG. 3C illustrates a detail of the Gain Control Block and surrounding circuitry in accordance with the present invention.

FIG. 3C shows another example of a configuration of the gain control block 317. As in the embodiment of FIG. 3B, filters 601 and 602 pass two different frequency ranges of amplitude correction signal 316 to control the VGA 308 and the high BW power supply 310, respectively, as described previously. In this embodiment, however, the VGA correction signal 318 is sensed, summed with Vctrl 611 by a first adder 613, averaged using lowpass filter 610, and summed by a second adder 615 into the power supply control signal 324. The scheme yields the ability to control the compression level of PA 104, but differs from the example described in FIG. 3B in two ways. First, the control of the VGA 308 is no longer DC-blocked, and the gain offset is imposed into the control path of the high BW power supply 310 rather than the control path of the VGA 308. Second, the offset imposed into the control path of the high BW power supply 310 is a function of Vctrl 611 and is further offset by the average of the VGA correction signal 318. Since the VGA correction signal 318 controls the portion of the gain of the VGA 308 that is commanded by the amplitude correction loop (termed here "correction gain,"), the average of the VGA correction signal 318 directly represents the average correction gain of the VGA 308. Further, if the VGA correction signal 318 represents the correction gain of the VGA 308 with a linear-in-log function—that is, a linear change in VGA correction signal 318 yields a change in the logarithm of the gain of VGA 308—then a given setting of Vctrl 611 results in a consistent level of compression of PA 104 (in dB) even as the average power level of the PA 104 changes. For example, if Vctrl 611 is set to a value of −0.5V, the amplitude correction loop forces the correction gain of the VGA 308 to +5 dB (if in this example a 0.1V change in the VGA correction signal 318 represents a 1 dB change in the correction gain of the VGA 308, and if the gain of the PA 104 and attenuation of the attenuator 370 are balanced so that the inputs to the comparator 312 are approximately equal when the gain of VGA 308 is 0 dB (see FIG. 3A)). This is advantageous since Vctrl 611 need not be adjusted as the PA average output power changes.

Referring back to FIG. 3A, the overall operation of the amplitude correction loop across RF input power to PA 104 is as follows. When the input 321 to the PA 104 increases, the output 110 of the PA 104 also increases. As the PA 104 stays in its linear region of operation, which corresponds to small input signals, its output 110 will increase linearly with its input 321. Thus, both inputs 105, 314 to the comparator 312 will rise by the same amount, resulting in no error correction to the high BW power supply 310 nor the VGA 308. This is the case when the output power is relatively small and well below the saturation point.

As the input power continues to rise at the input 321 of PA 104, there will be a point beyond which the output of the PA 104 will no longer be directly proportional with the input 321 to the PA 104. The amplitude correction loop will detect this error between the output 110 and input 321 of the PA 104, and raise the supply voltage 319 to the PA 104 and increase the gain of VGA 308 such that the initially-desired output power is delivered, resulting in linear operation of the system, even with a non-linear PA 104.

The overall RF transmitter circuit described relies on the dynamic range and control bandwidth of the VGA 308 to enable reconstruction of the desired RF signal amplitude based on the amplitude component 105, and also to correct some high frequency components of the amplitude error of PA 104. Thus the VGA 308 handles most of the rapid and deep amplitude changes, while allowing the high BW power supply 310 to handle a much narrower range of variation or fluctuation, and to operate with a lower bandwidth.

Many conventional polar modulation techniques require the power supply 310 to follow the amplitude component 105 itself. The amplitude component 105 may vary by 40 dB, and varies much faster between −10 dBc to −40 dBc than it does between 0 dBc to −10 dBc, for a typical phase and amplitude modulated signal. Thus the bandwidth (rate of change of output voltage) and output voltage range requirements demanded of the power supply 310 are severe, and prevent the use of an efficient switching regulator (SMPS) for power supply 310 for wideband RF signals. Therefore, conventional RF power amplifier control systems typically use linear regulators (rather than an SMPS) to adjust the supply voltage to the PA 104. Such a linear regulator by itself consumes power resulting from its current multiplied by the voltage drop across the linear regulator. When there is a large drop in the amplitude signal, this can result in significant power being lost and results in none or little reduction in the overall battery power being consumed by the RF transmitter. This is because any efficiency gained in the RF PA is mostly lost in the linear regulator itself.

In contrast, in the present invention, the high BW power supply 310 is far easier to implement because it follows a signal based on the amplitude correction signal 316, which has a narrow range of variation and lower rate of change. Thus, a highly efficient switching regulator may be used, resulting in a substantial reduction in the overall battery power being consumed by the RF transmitter.

Varying the supply voltage 319 to the PA 104 also results in a phase change. Thus, the phase correction loop operates in conjunction with the amplitude correction loop to maintain the accuracy of RF modulation at the output signal of the PA 104. Note that the phase correction loop is also an error correction loop only, and therefore minimally contributes to noise.

The phase correction loop monitors the phase modulated signal 108 from the polar modulator 102 and compares the phase of the phase modulated signal 108 with the phase of the output signal 110 of the PA 104, resulting in a control signal 337 that varies the phase of the PA input signal 321 coming out of the phase shifter 320. More specifically, a limiter 332 receives the output signal 110 of the PA 104 (in this example attenuated by an attenuator 370), and outputs its phase signal 333 to the phase comparator 334. The phase signal 333 is then compared by the phase comparator 334 to the phase modulated signal 108 from the polar modulator 102 (optionally further limited by the limiter 330). The comparator 334 generates a phase error signal 335 based on the difference between the phases of the signals 331, 333. Note that the term "phase error signal" is used herein synonymously with the term "phase correction signal." The phase error signal 335 is filtered by a phase loop filter (PLF) 336 to generate the phase control signal 337. The loop filter 336 completes the phase loop and provides the necessary gain, bandwidth limitation, and loop stability required for the phase loop to function properly. The particular loop filter used here can be of any type, and can include multiple integration and derivation stages so as to satisfy the best loop performance. The types of the loop filter may include classical types I, II, and the like. A particularity of this phase loop design is that the group delay through the PA 104 must be taken into account for stability reasons. This is achieved by choosing the proper pole-zero placement in the loop filter and may include delay compensation. The phase control signal 337 is input to the phase shifter 320 to control the shifting of the phase of the input RF signal so that the difference between the phase of the output signal 110 and the phase of the phase modulated signal 108 from the polar modulator 102 is held approximately constant.

The phase correction loop counteracts AM (Amplitude Modulation) to PM (Phase Modulation) characteristics of the PA 104, which is part of the normal distortion characteristics of transistor-based amplifiers. The phase correction loop allows for the phase of the RF signal at the output 110 of the PA 104 to track the phase-modulated component of desired RF signal 108 and thus reduces phase distortion generated by the PA 104. This phase correction loop contributes to linearizing the PA 104 as the AM to PM phase shift of the PA 104 tends to become higher at higher power levels. By limiting the effects of AM to PM of the PA 104, the phase correction loop allows the PA 104 to function at higher power levels with less distortion for the output signal 110, thus allowing the use of the PA 104 in more favorable efficiency conditions. In addition, the phase correction loop also helps in correcting any additional AM to PM characteristics that the amplitude correction loop may cause.

Finally, note that the VGA 308 is controlled by both a feed-forward signal (amplitude component 105) and a feedback signal (VGA control signal 318), and thus serves a dual function. The use of a single VGA 308 to handle both feed-forward and feedback control may be advantageous in simplifying system complexity and reducing noise, when compared to a scheme using two VGAs. However, the use of two separate VGAs to handle feed-forward and feedback control separately is still within the spirit of the invention described.

Figure 4:
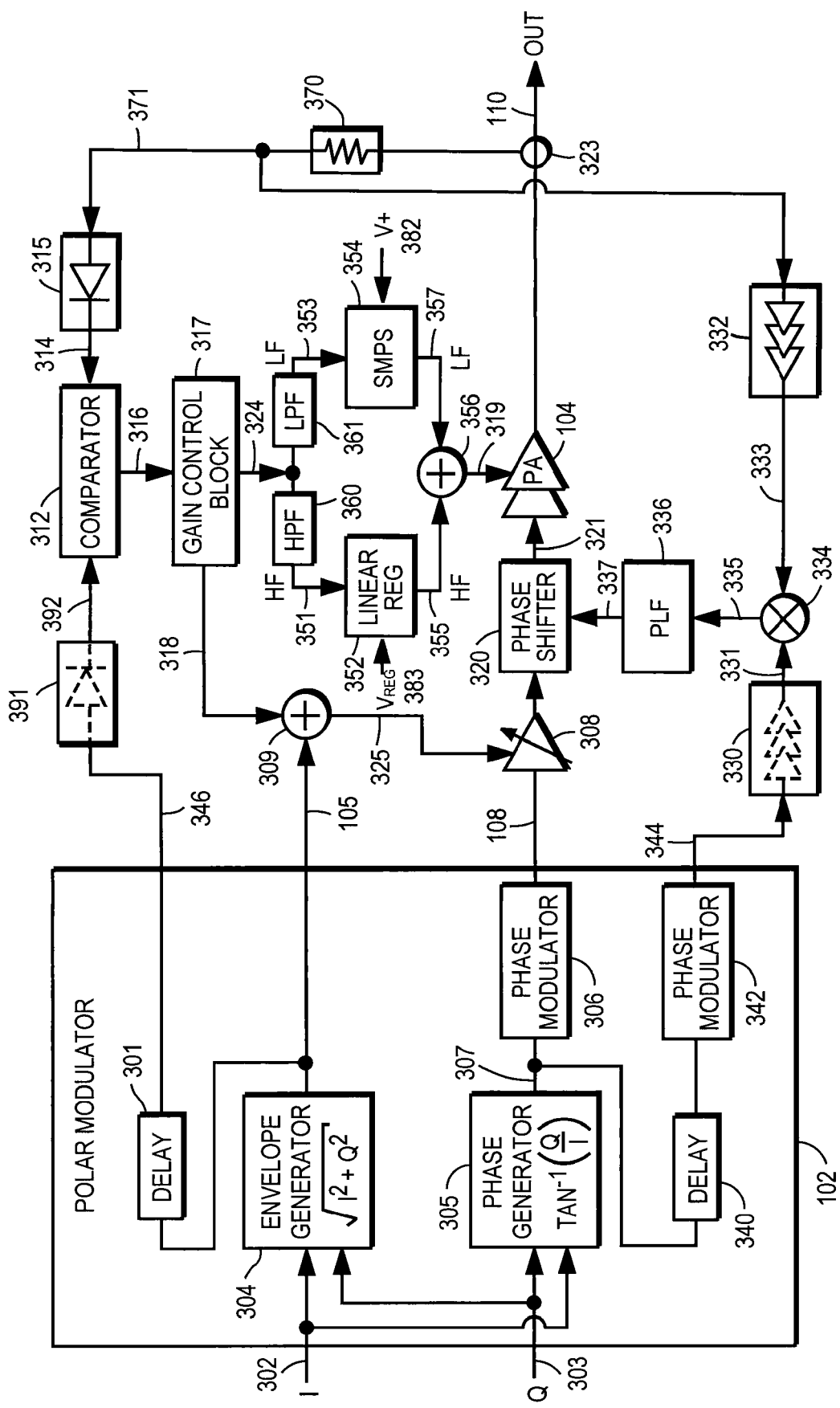
FIG. 4 illustrates an RF transmitter circuit including delay blocks and a split power supply in accordance with a second embodiment of the present invention.

FIG. 4 illustrates an RF transmitter circuit in accordance with a second embodiment of the present invention. The circuit in FIG. 4 is similar to the circuit of FIG. 3A with a few variations as will be described. First, delayed versions 346, 344 of the amplitude component 105 and the phase-modulated signal 108 of the desired RF signal are applied to the amplitude and phase correction loops, respectively. In one embodiment, a delay block 301 is inserted between the envelope generator 304 and the comparator 312 in the amplitude correction loop. A delay block 340 in series with another phase modulator 342 is also inserted between the phase generator 305 and the limiter 330 of the phase correction loop. The phase modulator 342 may be a duplicate of the phase modulator 306. Alternatively, the delay block 340 can be inserted after the phase modulator 306 to eliminate the need for the duplicate phase modulator 342. However, a delay block inserted after phase modulator 306 may increase the complexity of the RF phase shifter 320; thus for ease of implementation, it is generally preferable to insert the delay 340 prior to phase modulation 342 as in the illustrated embodiment.

The delays 301, 340 compensate for the delay through the PA 104, VGA 308, and phase shifter 320 (if present). This allows the feedback signals (e.g., based on output 110) to align more closely with the reference signals 344, 346 and avoids glitches that may occur due to misalignment. The delay blocks 301, 340 may be implemented using a variety of digital and/or analog components.

A second difference included in the embodiment of FIG. 4 is that a split power supply is inserted in place of the high BW power supply 310. In this embodiment, the power supply control signal 324 is split into two signals utilizing filters 360, 361—a high frequency amplitude correction signal 351 that is fed into a high frequency path including a linear regulator 352 powered by a supply, $V_{REG}$ 383, and a low frequency amplitude correction signal 353 that is fed into a low frequency path including a Switched Mode Power Supply (SMPS) 354 powered by a supply, V+ 382. The outputs of the linear regulator 352 and the SMPS 354 are combined in the adder block 356 to generate the PA supply voltage 319 to the PA 104. For example, a simple current adding node, a small, high frequency transformer or other types of power combiners or active electronic solutions can be used as the adder block 356.

The high frequency amplitude correction signal 351 is input to the linear regulator 352, which generates the high frequency part 355 of the PA supply voltage 319. The low frequency amplitude correction signal 353 is input to the SMPS 354, which generates the low frequency part 357 of the PA supply voltage 319. The adder block 356 combines the high frequency part 355 and the low frequency part 357 to generate the PA supply voltage 319 to the PA 104 in order to keep the PA 104 in an efficient operation range. In one embodiment, the upper end of the low frequency amplitude correction signal 353 can be as low as 1/20th of the spectrally occupied bandwidth for the RF signal. In some embodiments, the upper end of the low frequency amplitude correction signal 353 may not be fixed but may be adjusted dynamically to achieve optimum performance of the RF transmitter circuit.

Using both a high efficiency path comprised of the SMPS 354 carrying the low frequency portion 353 of the power supply correction signal 324 and a low efficiency path comprised of the linear regulator 352 carrying the high frequency portion 351 of the power supply correction signal 324 has the advantage that it is possible to use an SMPS 354 with a limited frequency response. In other words, the SMPS 354 need not accommodate for very high frequencies but just accommodates for a limited range of lower frequencies of the power supply correction signal 324, making the SMPS 354 much easier and more cost-effective to implement. Combining the SMPS 354 with the linear regulator 352 enables high bandwidths of operation accommodating for full frequency ranges of the power supply correction signal 324 without sacrificing the overall efficiency of the RF PA circuit in any significant way, since most of the energy of the power supply correction signal 324 that is contained in the low frequency part 353 of the power supply correction signal 324 is processed by the more efficient SMPS 354 rather than the less efficient linear regulator 352.

Figure 5:
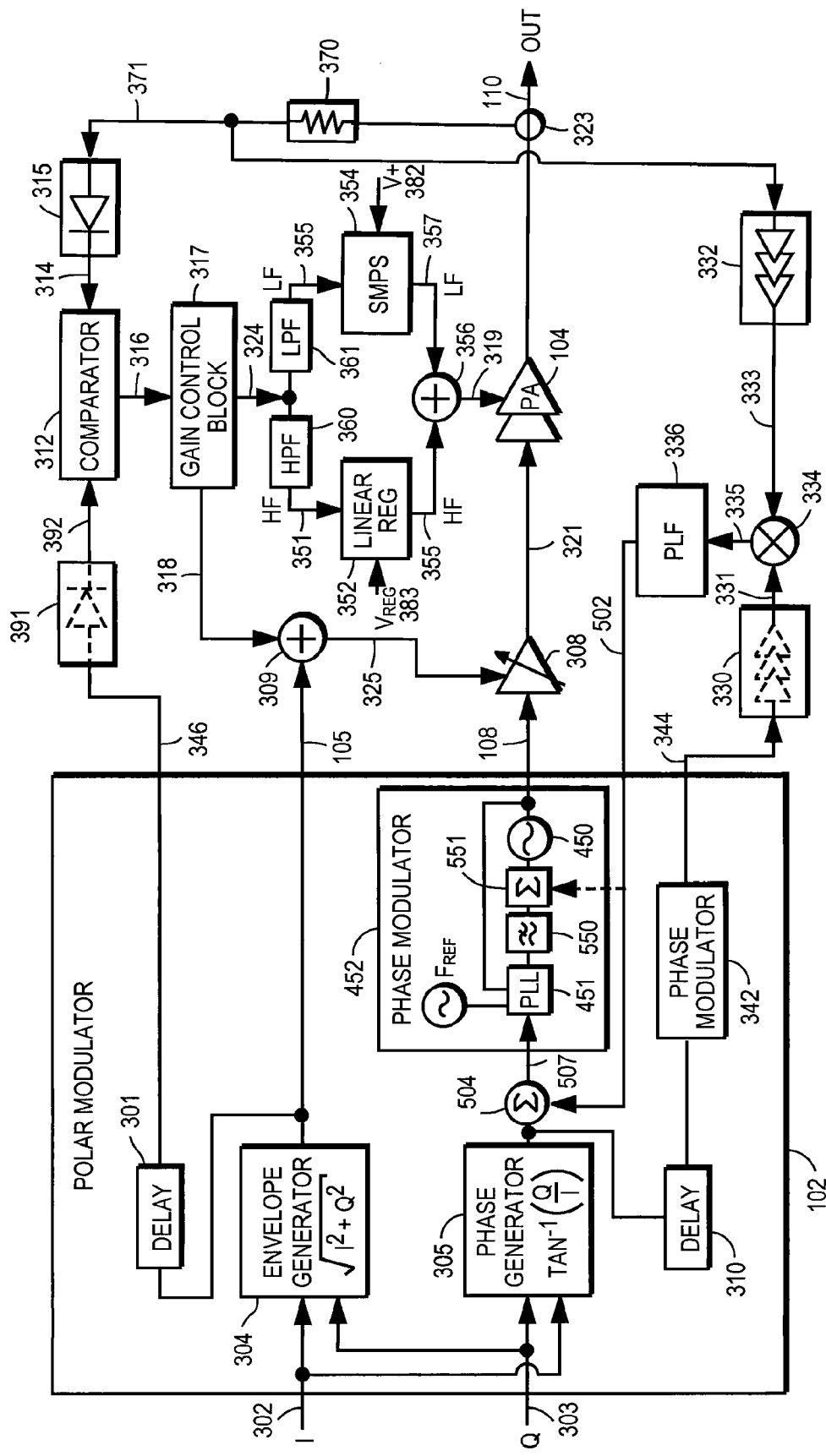
FIG. 5 illustrates an RF transmitter circuit having an alternative phase correction loop configuration in accordance with a third embodiment of the present invention.

FIG. 5 illustrates yet another RF transmitter circuit in accordance with a third embodiment of the present invention. The circuit is similar to the embodiment of FIG. 4 but varies the implementation of the phase correction loop. In this embodiment, the phase shifter 320 in FIG. 4 is eliminated and the output of the VGA 308 is connected directly to the PA input 321. The PLF output 502, which represents the loop phase error, is instead summed with the output of the phase generator 305 at a summer 504, thus providing a pre-shifted phase component 507 to the phase modulator 452. Thus, the phase modulated signal 108 now includes the equivalent phase shifts present after the phase shifter 320 in the embodiments described in FIGS. 3A and 4, but without requiring the phase shifter 320. The embodiment advantageously shifts the phase prior to the phase modulator 452 rather than in the RF path. This removes a potential source of noise and design complexity from the RF signal path.

In one example, the phase shifting operates by adding the PLF output 502 "over the loop" in to the VCO (Voltage Controlled Oscillator) 450, utilizing adder 551, which allows control of the phase modulator 452 outside of the normal PLL loop bandwidth, which is generally limited by the PLL loop filter 550. As is known in the art, careful scaling and calibration of the added phase error signal 502 is often required in this "over the loop" technique to accurately yield the desired phase shift, since a change in the level of added phase error signal 502 may yield a variable change in phase of the VCO 450, due to the variability of the Kvco factor of the VCO 450 over temperature, process, and operating frequency. However, advantageously, the degree of such calibration may be reduced or eliminated in the present invention, since the phase modulator itself is included within the phase correction loop. Thus, deviations from the expected phase response in "over the loop" modulation are largely corrected by the phase correction loop.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A power amplifier controller circuit for receiving from a polar transmitter a phase component and an amplitude component of a desired transmit signal and for controlling a power amplifier, the power amplifier coupled to receive and amplify an input signal and generate an output signal, the power amplifier controller circuit comprising:
   an amplitude correction loop determining an amplitude correction signal indicative of an amplitude difference between the amplitude component of the desired transmit signal from the polar transmitter and an attenuated amplitude of the output signal;
   a power supply providing a supply voltage to the power amplifier determined by at least a portion of the amplitude correction signal; and
   one or more variable gain amplifiers collectively adjusting the amplitude of the input signal based upon a portion of the amplitude correction signal and at least a portion of the amplitude component of the desired transmit signal from the polar transmitter.

2. The power amplifier controller circuit of claim 1, further comprising a phase correction loop determining a phase error signal indicative of a phase difference between the phase component of the desired transmit signal from the polar transmitter and a phase of the output signal and adjusting the phase component of the desired transmit signal from the polar transmitter to reduce phase distortion generated by the power amplifier.

3. The power amplifier controller circuit of claim 2, wherein the phase correction loop comprises:
   a phase comparator comparing the phase component of the desired transmit signal from the polar transmitter with the phase of the output signal to generate the phase error signal; and
   a phase shifter coupled to the phase comparator and an input of the power amplifier, the phase shifter shifting the phase of the phase component of the desired transmit signal from the polar transmitter based upon the phase error signal.

4. The power amplifier controller circuit of claim 2, wherein the phase correction loop further comprises:
   a phase delay block generating a delayed phase component of the desired transmit signal from the polar modulator;
   wherein the phase correction loop compares the delayed phase component of the desired transmit signal from the polar transmitter to the phase of the output signal to determine the phase correction signal.

5. The power amplifier control circuit of claim 1, wherein the amplitude correction loop comprises:
   a variable attenuator coupled to the power amplifier, the variable attenuator attenuating the output signal of the power amplifier;
   an amplitude detector coupled to the variable attenuator, the amplitude detector detecting the attenuated amplitude of the output signal from the variable attenuator; and
   an amplitude comparator coupled to the amplitude detector, the amplitude comparator comparing the amplitude component of the desired transmit signal from the polar transmitter with the detected attenuated amplitude of the output signal to generate the amplitude correction signal.

6. The power amplifier controller circuit of claim 1, wherein the amplitude correction loop comprises:
   a gain control circuit receiving the amplitude correction signal and allocating a first portion of the amplitude correction signal to control the power supply and allocating a second portion of the amplitude correction signal to control the one or more variable gain amplifiers.

7. The power amplifier controller circuit of claim 6, wherein the gain control block comprises:
a first filter receiving the amplitude correction signal and outputting a first frequency range of the amplitude correction signal to control the power supply; and
a second filter receiving the amplitude correction signal and outputting a variable gain amplifier correction signal comprising a second frequency range of the amplitude correction signal to control the one or more variable gain amplifiers.

8. The power amplifier controller circuit of claim 7, wherein the gain control block receives a control signal coupled to the output of the second filter, the control signal controlling the average gain of the one or more variable gain amplifiers.

9. The power amplifier controller circuit of claim 7, where the gain control block further subtracts an offset from the first frequency range of the amplitude correction signal based on the average of the second frequency range of the amplitude correction signal and a control signal input.

10. The power amplifier controller of claim 7, wherein the gain control block further comprises:
a first adder coupled to the second filter and summing the variable gain amplifier correction signal and a control signal input to generate a summed output;
a lowpass filter receiving the summed output from the first adder and generating an average summed output; and
a second adder coupled between the lowpass filter and the first filter, the second adder summing the first frequency range outputted from the first filter and the average summed output from the lowpass filter to generate a power supply correction signal to control the power supply.

11. The power amplifier controller circuit of claim 1, wherein the amplitude correction loop further comprises:
an amplitude delay block generating a delayed amplitude component of the desired transmit signal from the polar modulator;
wherein the amplitude correction loop compares the delayed amplitude component of the desired transmit signal from the polar transmitter to the attenuated amplitude of the output signal to determine the amplitude correction signal.

12. The power amplifier control circuit of claim 1, wherein the power supply is a switched mode power supply.

13. The power amplifier control circuit of claim 1, wherein the power supply comprises:
a first power supply with a first efficiency, the first power supply receiving a first portion of the amplitude correction signal in a first frequency range and generating a first adjusted supply output based upon the first portion of the amplitude correction signal; and
a second power supply with a second efficiency higher than the first efficiency, the second power supply receiving a second portion of the amplitude correction signal in a second frequency range lower than the first frequency range and generating a second adjusted supply output based upon the second portion of the amplitude correction signal, the supply voltage including a combination of the first adjusted supply output and the second adjusted supply output.

14. The power amplifier control circuit of claim 13, wherein:
the first power supply is a linear regulator; and
the second power supply is a switched mode power supply.

15. The power amplifier control circuit of claim 13, wherein the amplitude correction loop further comprises:
a power combiner circuit coupled to the first power supply and the second power supply, the power combiner circuit combining the first adjusted supply output and the second adjusted supply output to generate the supply voltage provided to the power amplifier.

16. The power amplifier controller circuit of claim 1, further comprising a phase correction loop to reduce phase distortion generated by the power amplifier, the phase correction loop determining a difference between the phase component of the desired transmit signal from the polar transmitter and the phase of the output signal to generate a feedback phase correction signal, wherein the polar transmitter adjusts the phase component of the desired transmit signal responsive to the feedback phase correction signal.

17. The power amplifier controller circuit of claim 1, further comprising:
a phase delay block receiving the phase component of the desired transmit signal from the polar transmitter and generating a delayed phase component of the desired transmit signal;
a first phase modulator receiving the delayed phase component of the desired transmit signal and generating a delayed phase modulated signal;
a phase comparator comparing the delayed phase modulated signal with the phase of the output signal to generate a phase error signal; and
a second phase modulator receiving the phase component of the desired transmit signal from the polar transmitter and the phase error signal, the second phase modulator shifting the phase of the phase component to reduce phase distortion generated by the power amplifier and modulating the shifted phase component to generate a phase modulated component of the desired transmit signal.

18. A radio frequency (RF) transmitter circuit comprising:
a polar transmitter generating a phase component and an amplitude component of a desired transmit signal;
a power amplifier coupled to receive and amplify an input signal and generate an output signal;
an amplitude correction loop determining an amplitude correction signal indicative of an amplitude difference between the amplitude component of the desired transmit signal from the polar transmitter and an attenuated amplitude of the output signal;
a power supply providing a supply voltage to the power amplifier determined by at least a portion of the amplitude correction signal; and
one or more variable gain amplifiers collectively adjusting the amplitude of the input signal based upon a portion of the amplitude correction signal and at least a portion of the amplitude component of the desired transmit signal from the polar transmitter.

19. A method for controlling a power amplifier, the power amplifier coupled to receive and amplify an input signal and generate an output signal, the method comprising:
receiving from a polar transmitter, a phase component and an amplitude component of a desired transmit signal;
comparing the amplitude component of the desired transmit signal from the polar transmitter and an attenuated amplitude of the output signal to generate an amplitude correction signal indicative of an amplitude difference between the amplitude component of the desired transmit signal from the polar transmitter and the attenuated amplitude of the output signal;

adjusting a power supply voltage or bias to the power amplifier based upon at least a portion of the amplitude correction signal; and adjusting the amplitude of the input signal based upon a portion of the amplitude correction signal and at least a portion of the amplitude component of the desired transmit signal from the polar transmitter.

20. The method of claim 19, wherein comparing the amplitude component of the desired transmit signal from the polar transmitter and the attenuated amplitude of the output signal comprises:

generating a delayed amplitude component of the desired transmit signal based on an RF path delay between the input signal and the output signal; and comparing the delayed amplitude component of the desired transmit signal to the attenuated amplitude of the output signal.

21. The method of claim 19, further comprising:

filtering the amplitude correction signal to generate a first frequency range of the amplitude correction signal and a second frequency range of the amplitude correction signal;

allocating the first frequency range of the amplitude correction signal to adjust the supply voltage or bias; and allocating the second frequency range of the amplitude correction signal to adjust the amplitude of the input signal.

22. The method of claim 19, further comprising:

comparing the phase component of the desired transmit signal from the polar transmitter to the phase of the output signal to generate a phase error signal indicative of a phase difference between the phase component of the desired transmit signal from the polar transmitter and the phase of the output signal; and shifting the phase of the desired transmit signal responsive to the phase error signal to reduce phase distortion generated by the power amplifier.

23. The method of claim 22, wherein comparing the phase component of the desired transmit signal from the polar transmitter to the phase of the output signal comprises:

generating a delayed phase component of the desired transmit signal based on an RF path delay between the input signal and the output signal; and comparing the delayed phase component of the desired transmit signal to the phase of the output signal.

24. The method of claim 19, further comprising:

generating a delayed phase component of the desired transmit signal based on an RF path delay between the input signal and the output signal;

modulating the delayed phase component of the desired transmit signal onto a carrier signal to generate a delayed phase modulated signal;

comparing the delayed phase modulated signal to the phase of the output signal to generate a phase error signal;

shifting the phase of the phase component of the desired transmit signal from the polar transmitter responsive to the phase error signal to generate a phase shifted phase component; and modulating the phase shifted phase component onto the carrier signal.

* * * * *